US011171258B2

(12) United States Patent
Leirer et al.

(10) Patent No.: US 11,171,258 B2
(45) Date of Patent: Nov. 9, 2021

(54) METHOD FOR MANUFACTURING A RADIATION-EMITTING SEMICONDUCTOR COMPONENT AND RADIATION-EMITTING SEMICONDUCTOR COMPONENT

(71) Applicant: OSRAM Opto Semiconductors GmbH, Regensburg (DE)

(72) Inventors: Christian Leirer, Friedberg (DE); Isabel Otto, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/493,438

(22) PCT Filed: May 3, 2018

(86) PCT No.: PCT/EP2018/061377
§ 371 (c)(1),
(2) Date: Sep. 12, 2019

(87) PCT Pub. No.: WO2018/206399
PCT Pub. Date: Nov. 15, 2018

(65) Prior Publication Data
US 2020/0013926 A1    Jan. 9, 2020

(30) Foreign Application Priority Data
May 10, 2017   (DE) .......................... 102017110076.8

(51) Int. Cl.
*H01L 33/38*   (2010.01)
*H01L 33/40*   (2010.01)
*H01L 33/44*   (2010.01)

(52) U.S. Cl.
CPC .............. *H01L 33/38* (2013.01); *H01L 33/40* (2013.01); *H01L 33/44* (2013.01); *H01L 2933/0016* (2013.01); *H01L 2933/0025* (2013.01)

(58) Field of Classification Search
CPC ....... H01L 29/401–40111; H01L 33/38; H01L 33/52–56; H01L 23/3142; H01L 33/40; H01L 33/44
See application file for complete search history.

(56) References Cited

U.S. PATENT DOCUMENTS 5,796,168 A  *  8/1998  Datta ...................... H01L 24/11
                                                    257/762
5,886,393 A  *  3/1999  Merrill .................... H01Q 1/27
                                                    257/531
(Continued)

FOREIGN PATENT DOCUMENTS

DE          10324645 A1      2/2004
DE     102015114579 A1  *   3/2017  ............. H01L 33/62
(Continued)

OTHER PUBLICATIONS

Zaouk, Rabih & Park, Benjamin & Madou, Marc. (2006). Introduction to Microfabrication Techniques. Methods in molecular biology (Clifton, N.J.). 321.5-15. 10.1385/1-59259-997-4:3. (Year: 2006).*

(Continued)

*Primary Examiner* — Vincent Wall
(74) *Attorney, Agent, or Firm* — Slater Matsil, LLP

(57) ABSTRACT

A method for manufacturing a radiation-emitting semiconductor device and radiation-emitting semiconductor device are disclosed. In an embodiment a method includes providing a radiation-emitting semiconductor chip having a first main surface including a radiation exit surface of the semiconductor chip, applying a metallic seed layer to a second (Continued)

main surface of the semiconductor chip opposite to the first main surface, galvanically depositing a first metallic layer on the seed layer for forming a first electrical contact point and a second electrical contact point, galvanically depositing a second metallic layer on the first metallic layer for forming the first electrical contact point and the second electrical contact point, wherein a material of the first metallic layer and a material of the second metallic layer are different, and applying a casting compound between the contact points.

9 Claims, 6 Drawing Sheets

(56) References Cited

U.S. PATENT DOCUMENTS

| | | | |
|---|---|---|---|
| 6,172,141 B1* | 1/2001 | Wong | C08K 3/36 523/455 |
| 6,903,376 B2 | 6/2005 | Shen et al. | |
| 9,006,766 B2 | 4/2015 | Kojima et al. | |
| 10,263,155 B2 | 4/2019 | Perzlmaier et al. | |
| 2003/0207480 A1* | 11/2003 | Kobayashi | H01L 33/36 438/22 |
| 2012/0261608 A1* | 10/2012 | Hosomi | C23F 1/44 252/79.1 |
| 2013/0248910 A1* | 9/2013 | Kimura | H01L 33/0075 257/98 |
| 2013/0279169 A1 | 10/2013 | Reiherzer et al. | |
| 2013/0320382 A1* | 12/2013 | Kojima | H01L 33/62 257/98 |
| 2016/0035948 A1 | 2/2016 | Happoya et al. | |

FOREIGN PATENT DOCUMENTS

| | | |
|---|---|---|
| DE | 102015114579 A1 | 3/2017 |
| DE | 102015114583 A1 | 3/2017 |
| DE | 102015114590 A1 | 3/2017 |
| EP | 2710645 A1 | 3/2014 |
| KR | 101723201 B1 | 4/2017 |
| WO | 2013084126 A1 | 6/2013 |

OTHER PUBLICATIONS

Machine translation of DE102015114579A1 (Year: 2015).*

* cited by examiner

METHOD FOR MANUFACTURING A RADIATION-EMITTING SEMICONDUCTOR COMPONENT AND RADIATION-EMITTING SEMICONDUCTOR COMPONENT

This patent application is a national phase filing under section 371 of PCT/EP2018/061377, filed May 3, 2018, which claims the priority of German patent application 102017110076.8, filed May 10, 2017, each of which is incorporated herein by reference in its entirety.

TECHNICAL FIELD

A method of manufacturing a radiation-emitting semiconductor device and a radiation-emitting semiconductor device are provided.

BACKGROUND

A method for manufacturing radiation-emitting semiconductor devices and radiation-emitting semiconductor devices are described, for example, in German Publication No. 102015114583.

SUMMARY OF THE INVENTION

Embodiments provide a radiation-emitting semiconductor device with increased fracture stability. Further embodiments provide a method for manufacturing a radiation-emitting semiconductor device.

According to an embodiment of a method for manufacturing a radiation-emitting semiconductor device, a radiation-emitting semiconductor chip with a first main surface is provided. The first main surface of the radiation-emitting semiconductor device is preferably comprised of a radiation exit surface of the semiconductor chip.

According to a further embodiment of the method a metallic seed layer is applied to a second main surface of the semiconductor chip opposite to the first main surface. The seed layer can, for example, comprise one of the following materials or can consist of one of the following materials: Au, Ti, Cu, Al, Ag, Sn, Rh, Pt.

The seed layer can be deposited by one of the following methods: electroless plating, evaporation, PECVD (short for "Plasma Enhanced Chemical Vapor Deposition"), sputtering.

The seed layer has, for example, a thickness between 20 nanometers and 5 micrometers, inclusive. The preferred thickness of the seed layer is between 100 nanometers and 300 nanometers, inclusive. For example, the thickness of the seed layer has a value of approximately 200 nanometers.

The seed layer can also be constructed as a sequence of individual layers. For example, the seed layer can be formed from a titanium layer and a gold layer or from a titanium layer and a copper layer.

According to a further embodiment of the method, a first metallic layer is deposited galvanically on the seed layer for the formation of a first electrical contact point and a second electrical contact point.

Here and in the following, the term "galvanic deposition" refers to galvanic deposition under current flow, while the term "electroless plating" refers to galvanic deposition without current flow. Electroless plating is usually a precipitation reaction of metal ions from liquid onto a surface to be coated. Galvanic deposition is the deposition of metal ions on a surface to be coated from a liquid electrolyte by applying an external voltage, wherein an electric current forms in the liquid electrolyte.

According to a further embodiment of the method, a second metallic layer is deposited galvanically on the first metallic layer also to form the first electrical contact point and the second electrical contact point, wherein the material of the first metallic layer and the material of the second metallic layer are different from each other.

The first metallic layer and the second metallic layer can, for example, comprise one of the following materials or consist of one of the following materials: Ni, Au, Cu, Zn, Al, Sn.

For example, the following material pairings are suitable as materials for the first metallic layer and the second metallic layer: Ni/Au, Ni/Zn, Ni/Al, Au/Zn, Cu/Ni, Cu/Au.

According to a further embodiment of the method, a plurality of first metallic layers and a plurality of second metallic layers are deposited alternately, forming the first electrical contact point and the second electrical contact point.

According to a further embodiment of the method, a casting compound is applied at least between the contact points. The application of the casting compound is preferably carried out in such a way that the region between the contact points is completely filled by the casting compound. The casting compound initially prefers to completely enclose the contact points and forms a closed layer over the contact points with a planar surface. For example, the casting compound contains an epoxy resin, a silicone resin or a silicate-containing material. The casting compound may contain fillers such as glass beads.

According to a further embodiment of the method, the casting compound is partially removed again in a next step, such that the first main surfaces of the contact points are freely accessible from the outside. The first main surfaces of the contact points are turned away from the semiconductor chips. The removal of the casting compound occurs, for example, by grinding. The contact points and the casting compound are preferably flush with each other after the removal of the casting compound and form a planar surface.

According to a further embodiment of the method, a solderable layer is applied to the first main surfaces of the contact points, which are freely accessible after removal of the casting compound. If the first main surface of the contact points is already solderable, it is possible to dispense with the additional solderable layer. The solderable layer has preferably a thickness between 0.5 micrometer and 10 micrometer, inclusive. Particularly preferably, the solderable layer has a thickness between 3 micrometers and 5 micrometers, inclusive.

Possibly, a further layer is applied to the solderable layer or to the first main surface of the contact points to prevent oxidation of the underlying material. This layer has preferably a thickness between 10 nanometers and 100 nanometers, inclusive.

The casting compound is intended to mechanically stabilize the semiconductor device. Preferably, the casting compound stabilizes the semiconductor device in such a way that a prefabricated housing is no longer necessary for stabilization. The semiconductor device is preferably free of a prefabricated housing.

According to a further embodiment of the method, a structured dielectric layer with openings is applied to the seed layer before the first metallic layer and/or the second metallic layer is galvanically deposited. Then the material of the first metallic layer and/or the material of the second metallic layer is galvanically deposited through the openings of the dielectric layer, wherein the dielectric layer preferably remains free of the first metallic layer and/or the second metallic layer. For example, the dielectric layer comprises one of the following materials or consists of one of the following materials: SiN, $SiO_2$, $Al_2O_3$, $TiO_2$. For example, the dielectric layer has a thickness between 20 nanometers and 10 micrometers, inclusive. Particularly preferably, the dielectric layer has a thickness between 50 nanometers and 500 nanometers, inclusive.

According to a further embodiment of the method, the dielectric layer is at first applied over the entire surface of the seed layer and the openings in the dielectric layer are created by etching.

The dielectric layer can be underetched at the boundaries to the openings. Preferably, the undercuts are filled with the material of the first metallic layer and/or the material of the second metallic layer during the galvanic deposition of the first metallic layer and/or the second metallic layer. In such a way, expanded foot points can be formed for better anchoring of the contact points. A second main surface of the contact points preferably has an enlarged area compared to the first main surface, which is opposite to the second main surface.

According to a further embodiment of the method, structural elements of a photoresist are applied to the dielectric layer, which is formed over the entire surface, and the openings in the dielectric layer are created by etching the areas that are freely accessible.

Alternatively, it is also possible that no dielectric layer is used during the present method. Herein, the structural elements of the photoresist are applied directly to the seed layer and the first metallic layer and the second metallic layer are galvanically deposited between the structural elements of the photoresist. The structural elements preferably adjoin the first metallic layer(s) and the second metallic layer(s) directly. In such a way, straight side faces of the contact points can be formed.

According to a further embodiment of the method, the material of the first metallic layer or the material of the second metallic layer is selectively etched so that indentations are formed in the selectively etched layer(s) on the side faces of the contact points. For example, the material of the first metallic layer is selectively etched against the material of the second metallic layer so that indentations are formed in the first metallic layer. Alternatively, it is also possible to selectively etch the material of the second metallic layer against the material of the first metallic layer so that indentations are formed in the second metallic layer. For example, selective etching is carried out wet-chemically.

For example, potassium cyanide KCN or aqua regia (HCl/HNO3) are suitable as wet chemical etch. Potassium cyanide etches, for example, gold, copper or nickel, while there is selectivity to titanium or aluminum. Aqua regia, for example, etches gold or copper, while there is selectivity to silver.

The term "selective etching" here refers to an etching method whose etching rates for one material are significantly higher than for another material, for example, by a factor of 10. Particularly preferably, the etching rates are at present significantly higher for the material of the first metallic layer than for the material of the second metallic layer, or vice versa.

The indentations each are formed by lateral removal of the respective material from the selectively etched layer. The unetched layer usually protrudes laterally beyond the etched layer. For example, the indentations have a depth between 200 nanometers and 30 micrometers, inclusive. Preferably, the indentations have a depth between 3 micrometers and 7 micrometers, inclusive. The depth of the indentations means, for example, a distance between the side face of the respective unetched metallic layer and the deepest point of the side face of the respective etched metallic layer.

Particularly preferably, the indentations created by selective etching serve as anchoring structures to the casting compound that surrounds the contact points.

For example, each electrical contact is formed of several first metallic layers and of several second metallic layers. For example, each electrical contact is formed of including four to including ten first metallic layers and second metallic layers. Particularly preferably, each contact point is formed of two to six first metallic layers and second metallic layers. The first metallic layers and the second metallic layers are arranged alternately.

According to a further embodiment of the method, the first metallic layer is embodied three to ten times as thick as the second metallic layer. The second metallic layer, which is much thinner than the first metallic layer, is selectively etched to create the indentations.

For example, the first metallic layer and/or the second metallic layer have a thickness between 0.5 micrometers and 50 micrometers, inclusive. Preferably, the first metallic layer and/or the second metallic layer have a thickness between 5 micrometers and 20 micrometers, inclusive.

The finished electrical contact points, for example, have a thickness between 35 micrometers and 200 micrometers, inclusive. Preferably, the electrical contact points have a thickness between 50 micrometers and 150 micrometers, inclusive. A typical thickness of the electrical contact points is approximately 100 micrometers.

Particularly preferably, the method is a method, which is carried out with a wafer compound. Herein several semiconductor chips are provided at the same time, which are comprised by a common wafer. Advantageously, these semiconductor chips are then simultaneously processed according to the described method steps. This means that several radiation-emitting semiconductor devices can be produced in parallel, advantageously.

The method described herein is particularly suitable for producing a radiation-emitting semiconductor device. Features, which are described at present only in connection with the method, can therefore also be embodied in the radiation-emitting semiconductor device and vice versa.

A radiation-emitting semiconductor device has a radiation-emitting semiconductor chip with a first main surface comprised by a radiation exit surface of the semiconductor chip. Further, the radiation-emitting semiconductor chip comprises a first electrical contact point and a second electrical contact point arranged on a second main surface of the semiconductor chip. The second main surface of the semiconductor chip is located opposite to the first main surface.

According to a further embodiment of the radiation-emitting semiconductor device, each contact point has at least a first metallic layer and at least a second metallic layer.

According to a particularly preferred embodiment of the radiation-emitting semiconductor device, the first metallic layer or the second metallic layer has indentations starting from the side faces of the contact points. The indentations serve particularly preferably as anchoring structures for a casting compound that encloses the contact points. Particularly preferably, the casting compound encloses the contact points laterally completely, while the first main surface of the contact points is freely accessible.

According to a further embodiment of the radiation-emitting semiconductor device, a second main surface of each contact point facing the semiconductor chip has a larger area than a first main surface of each contact point opposite to the second main surface. In other words, the contact points preferably have expanded foot points, which can lead to improved anchoring of the contact points.

According to a further embodiment of the semiconductor device, each contact point comprises a plurality of first metallic layers and a plurality of second metallic layers arranged, which are arranged alternately. Furthermore, it is also possible that each contact point is formed of a plurality of first metallic layers and second metallic layers, which are arranged alternately.

The method and the semiconductor device are based on the idea of providing the side faces of electrical contact points with indentations that can be achieved, for example, by selectively etching alternating metallic layers of different materials. The indentations form mechanical anchoring structures for a casting compound that encloses the contact points, comparable to dowels. In such a way, the fracture stability of the radiation-emitting semiconductor device can be advantageously increased.

BRIEF DESCRIPTION OF THE DRAWINGS

Further advantageous embodiments and developments of the invention result from the exemplary embodiments described in the following in connection with the figures.

Figure 1:
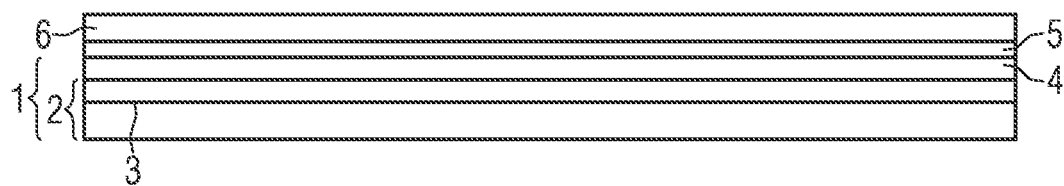
FIGS. 1 to 8 show schematic sectional views of a first exemplary embodiment of the method.

Equal or similar elements as well as elements of equal function are designated with the same reference signs in the FIGS. The FIGS. and the proportions of the elements shown in the FIGS. are not regarded as being shown to scale. Rather, single elements, in particular layers, can be shown exaggerated in magnitude for the sake of better presentation and/or better understanding.

DETAILED DESCRIPTION OF ILLUSTRATIVE EMBODIMENTS

In the method according to the exemplary embodiment of FIGS. 1 to 8, a semiconductor chip 1 is provided at first, which has an epitaxial semiconductor layer sequence 2 with a radiation-generating active zone 3. The active radiation generating zone 3 is arranged between an n-type region of the semiconductor layer sequence 2 and a p-type region of the semiconductor layer sequence 2. A semiconductor structure 4 with electrical contacts to the n-conducting region and the p-conducting region is applied to the epitaxial semiconductor layer sequence 2. The electromagnetic radiation generated in the active zone is emitted from a radiation exit surface of the semiconductor chip 1 comprising a first main surface of the semiconductor chip 1.

A seed layer 5 is applied to the semiconductor chip 1, for example, using one of the methods already mentioned. The seed layer 5 completely covers the surface of the semiconductor chip 1 at present. A dielectric layer 6 is applied to the entire surface of seed layer 5, also using one of the methods already mentioned. The resulting arrangement is shown schematically in FIG. 1.

Figure 2:
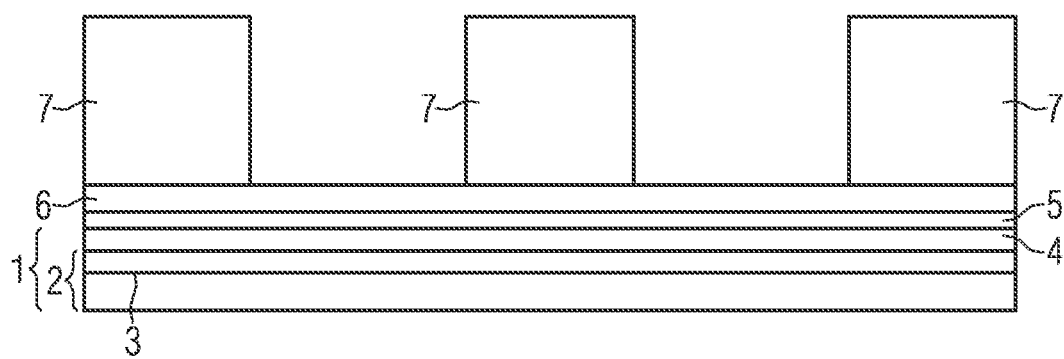

As schematically shown in FIG. 2, structural elements 7 of a photoresist are applied to the dielectric layer 6, wherein areas of the dielectric layer 6 remain freely accessible.

Figure 3:
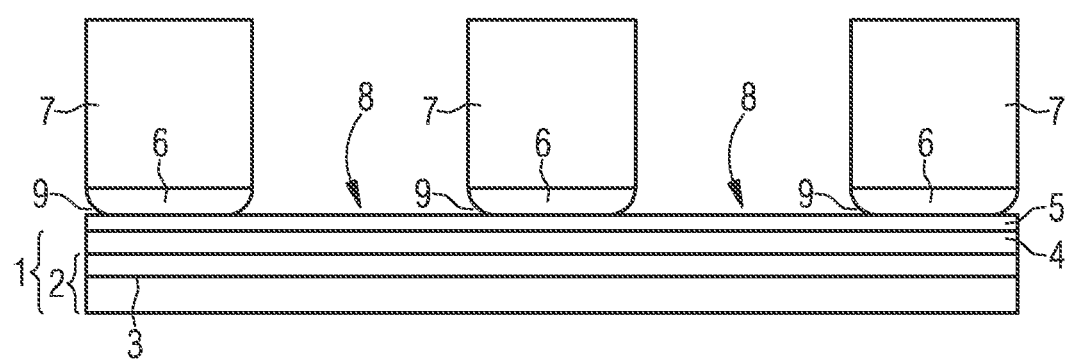

In a next step, the dielectric layer 6 is removed by etching in the areas that are freely accessible (FIG. 3). In such a way, openings 8 arise in the dielectric layer 6 in the areas not covered by the structural elements 7 of the photoresist. Herein, the dielectric layer 6 is preferably underetched starting from the boundaries of the openings 8, so that undercuts 9 occurs.

Figure 4:
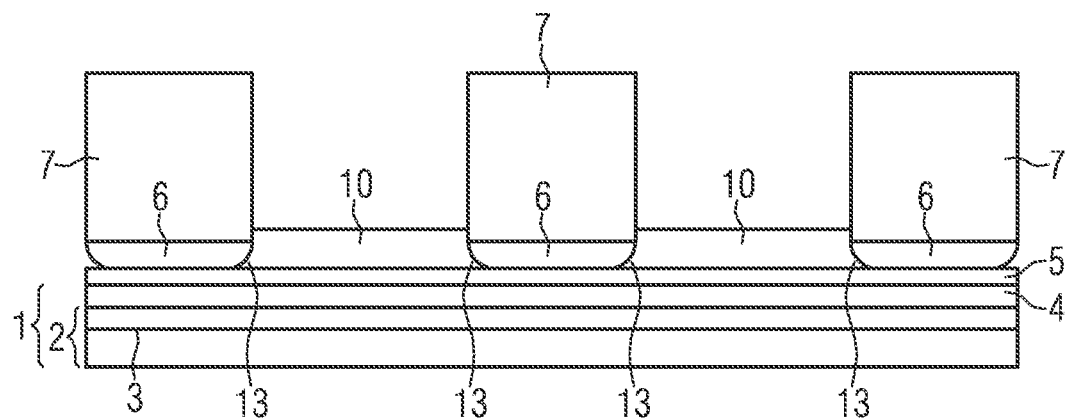
Figure 5:
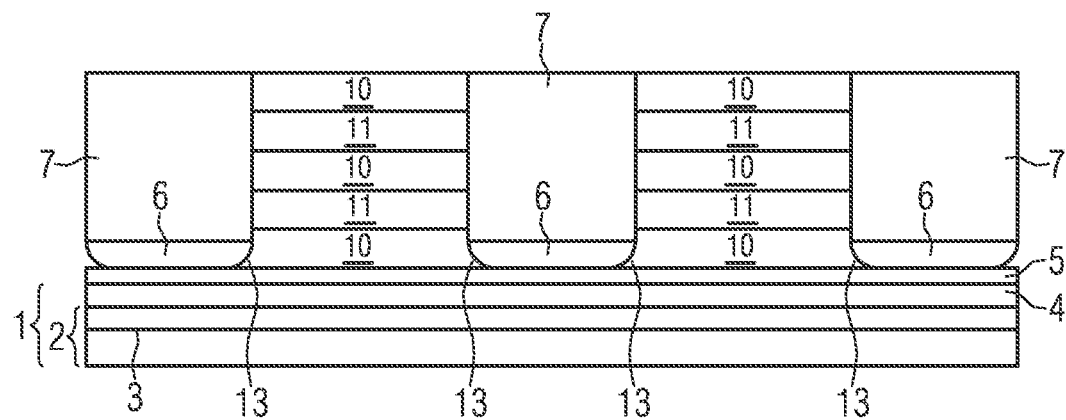

In the next step, shown schematically in FIG. 4, a first metallic layer 10 is applied between the structural elements 7 of the photoresist, for example, by galvanic deposition. Then, a second metallic layer 11 is galvanically deposited onto the first metallic layer 10. The first metallic layer 10 and the second metallic layer 11 have different materials. On the second metallic layer 11 a further first metallic layer 10 is galvanically deposited and on this further first metallic layer 10 a further second metallic layer 11. In other words, a plurality of first metallic layers 10 and a plurality of second metallic layers 11 are galvanically deposited between the structural elements 7 of the photoresist in an alternating sequence (FIG. 5). The first metallic layers 10 and the second metallic layers 11 essentially form two electrical contact points 12. The undercuts 9 are filled with the material of the first metallic layer 10 and form foot points 13 of the contact points 12.

Figure 6:
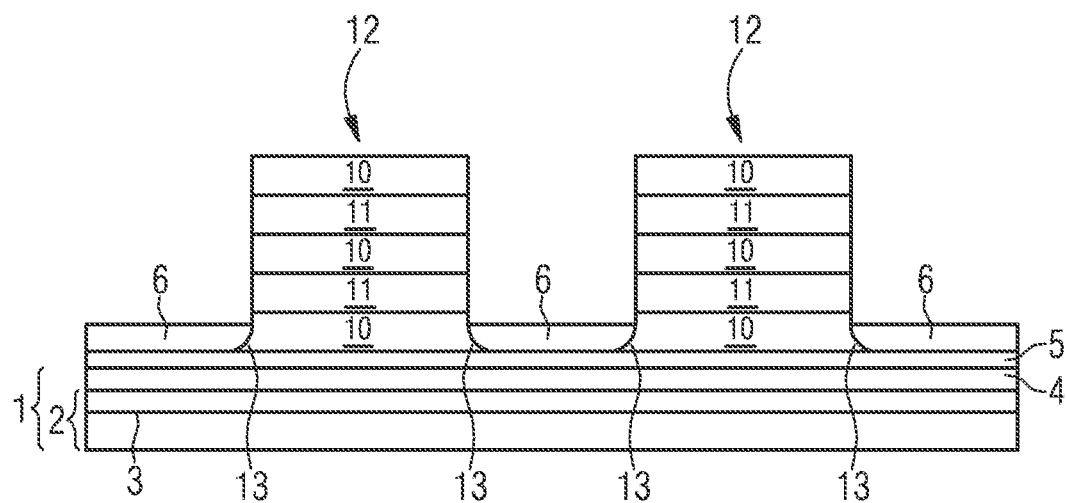

In the next step, which is shown schematically in FIG. 6, the structural elements 7 of the photoresist are removed again.

Figure 7:
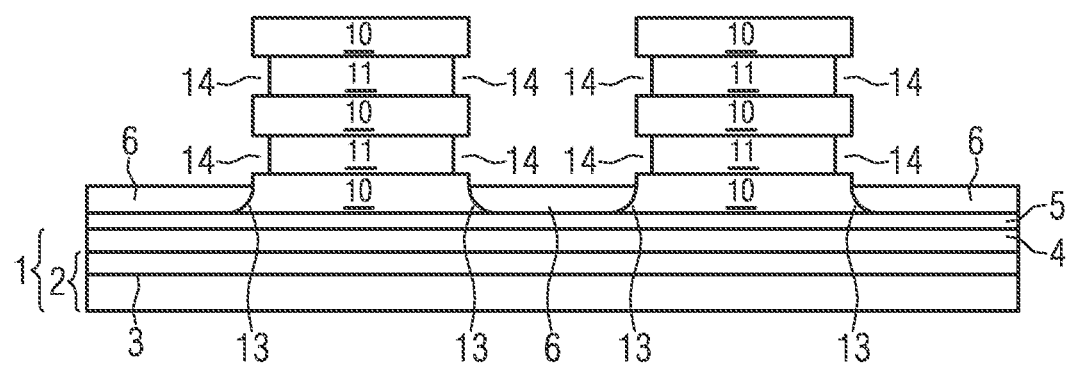

Then the second metallic layers 11 are selectively etched against the first metallic layers 10 so that indentations 14 are formed in the side faces of the contact points 12. The indentations 14 are formed within the second metallic layers 11, while the first second metallic layers 10 project laterally beyond the second metallic layers 11 (FIG. 7).

Figure 8:
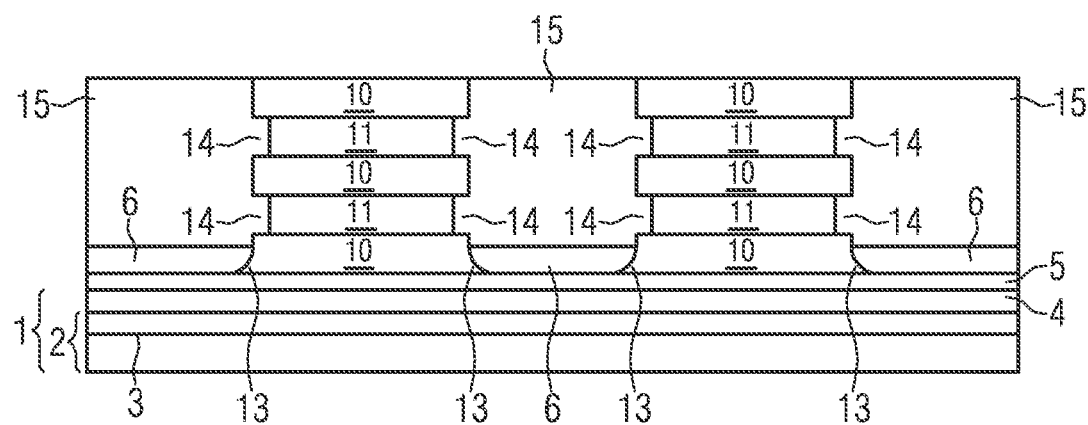

Then, a casting compound 15 is placed between the contact points 12, which initially completely encloses the contact points 12. The indentations 14 form mechanical anchoring structures to the casting compound 15. Finally, the casting compound 15 is removed by grinding in such a way that the first main surfaces of the contact points 12 are freely accessible (FIG. 8). Further, a solderable layer can be applied to the first main surfaces of the contact points 12 (not shown).

Figure 9:
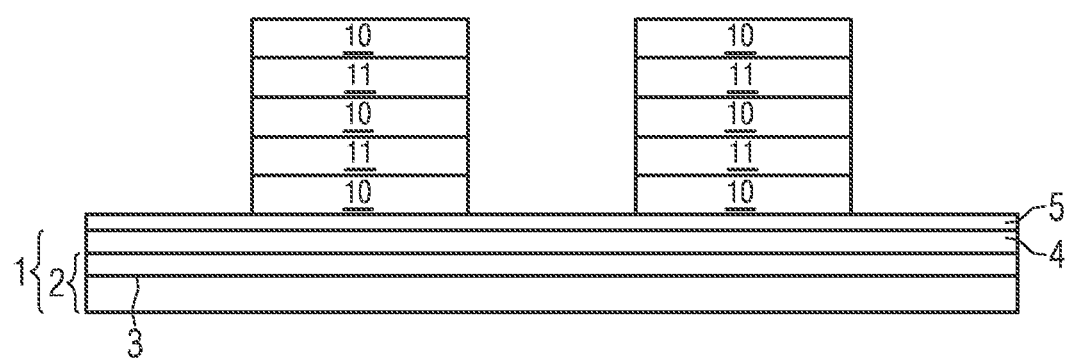
FIGS. 9 to 11 show schematic sectional views of a further exemplary embodiment of the method.
Figure 11:
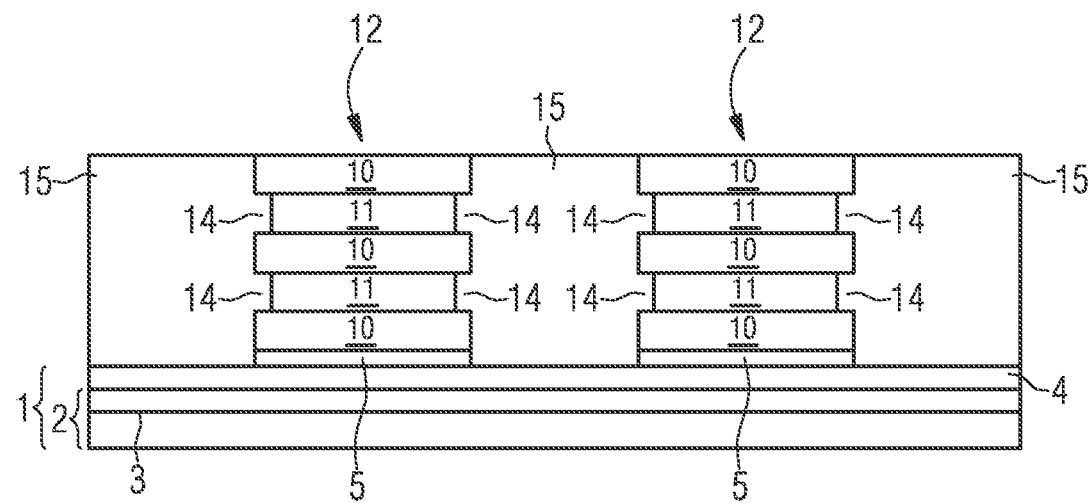

In contrast to the method according to the exemplary embodiment of FIGS. 1 to 8, no dielectric layer 6 is used in the method according to FIGS. 9 and 11. Instead, the structural elements 7 of the photoresist are applied directly to the seed layer 5 (not shown) and a plurality of first metallic layers 10 and a plurality of second metallic layers 11 are deposited between the structural elements 7 of the photoresist to form electrical contact points 12. Then, the structural elements 7 of the photoresist are removed again. Electrical contact points 12 are now applied to the seed layer 5. The contact points comprise alternatingly arranged first metallic layers and second metallic layers (FIG. 9). The first metallic layers 10 have a different material than the second metallic layers 11.

Figure 10:
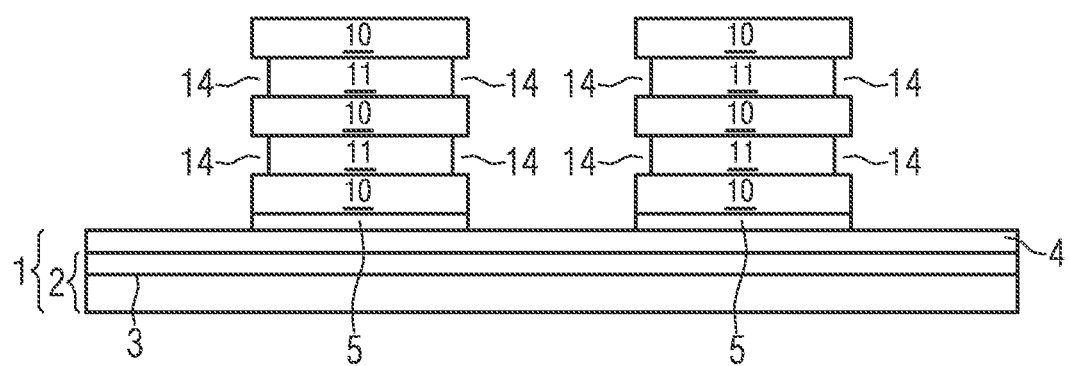

In a next step, schematically shown in FIG. 10, the second metallic layers 11 are selectively etched against the first metallic layers 10 so that indentations 14 are formed in the side faces of the contact points 12 within the second metallic layers 11. The second metallic layers 11 are much thinner than the first metallic layers 10. Selective etching also removes the seed layer in the areas where the seed layer is freely accessible.

In the next step, shown schematically in FIG. 11, the electrical contact points 12 are completely enclosed with a casting compound 15, while the first main surfaces of the contact points 12 remain free of the casting compound 15. The indentations 14 serve as mechanical anchoring structures to the casting compound 15.

Figure 12:
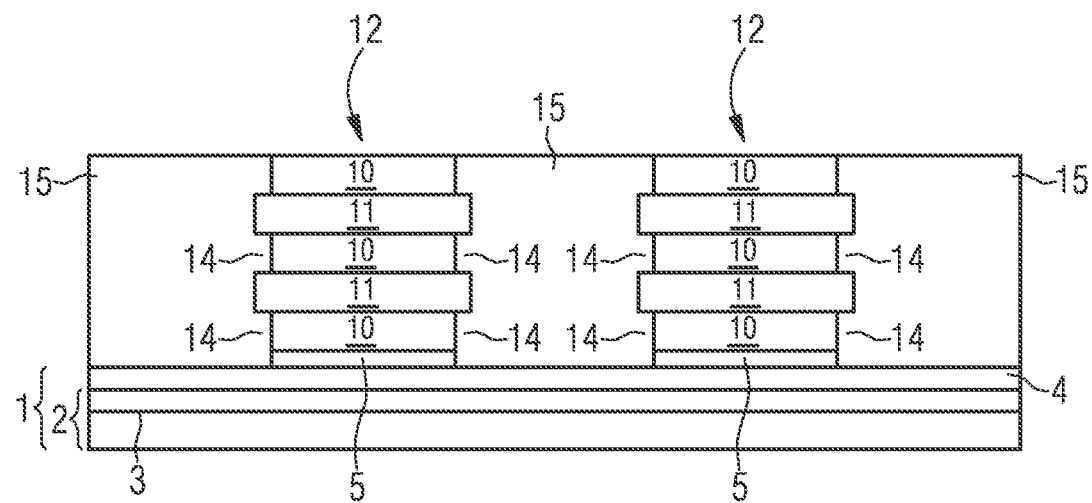
FIG. 12 shows a schematic cross-sectional view of a radiation-emitting semiconductor device according to an exemplary embodiment.

In contrast to the radiation-emitting semiconductor device according to FIG. 11, the first metallic layers 10 are selectively etched against the second metallic layers 11 in the case of the radiation-emitting semiconductor device according to the exemplary embodiment in FIG. 12. Consequently, the first metallic layers have 10 indentations 14, while the second metallic 11 layers protrude laterally beyond the first metallic layers 10.

The invention is not limited to the description of the exemplary embodiments. Rather, the invention comprises each new feature as well as each combination of features, particularly each combination of features of the claims, even if the feature or the combination of features itself is not explicitly given in the claims or exemplary embodiments.

The invention claimed is:

1. A method of manufacturing a radiation-emitting semiconductor device, the method comprising:
   providing a radiation-emitting semiconductor chip having a first main surface comprising a radiation exit surface of the semiconductor chip;
   applying a metallic seed layer to a second main surface of the semiconductor chip opposite to the first main surface;
   galvanically depositing a first metallic layer on the seed layer for forming a first electrical contact point and a second electrical contact point;
   galvanically depositing a second metallic layer on the first metallic layer for forming the first electrical contact point and the second electrical contact point,
   wherein a material of the first metallic layer and a material of the second metallic layer are different, and
   wherein the electrical contact points are formed by alternatingly depositing a plurality of first metallic layers and a plurality of second metallic layers; and
   applying a casting compound between the contact points, wherein the material of the first metallic layer or the material of the second metallic layer is selectively etched so that indentations are formed in the selectively etched layers on side faces of the contact points.

2. The method according to claim 1, wherein the indentations serve as anchoring structures for the casting compound, which encloses the contact points.

3. The method according to the claim 1, further comprising:
   applying a structured dielectric layer with openings to the seed layer before galvanically depositing the first metallic layer and/or the second metallic layer,
   wherein the material of the first metallic layer and/or the material of the second metallic layer is deposited through the openings of the dielectric layer, and
   wherein the dielectric layer remains free of the first metallic layer and/or of the second metallic layer.

4. The method according to claim 3,
   wherein the dielectric layer is applied to the seed layer over an entire surface of the seed layer, and
   wherein the openings in the dielectric layer are etched.

5. The method according to claim 4,
   wherein the dielectric layer is under-etched at boundaries to the openings, and
   wherein galvanically depositing the first metallic layer or the second metallic layer comprises filling undercuts with the material of the first metallic layer or the second metallic layer.

6. The method according to claim 1, further comprising:
   applying structural elements of a photoresist over an entire surface of a dielectric layer; and
   forming openings in the dielectric layer by etching freely accessible areas of the dielectric layer.

7. The method according to claim 1, further comprising:
   applying structural elements of a photoresist to the seed layer, and
   depositing the first metallic layer and the second metallic layer between the structural elements of the photoresist.

8. The method according to claim 1, wherein the first metallic layer and the second metallic layer comprise one of the following materials: Ni, Au, Cu, Zn, Al, or Sn.

9. The method according to claim 8, wherein the seed layer comprises one of the following materials: Au, Ti, Cu, Al, Ag, Sn, Rh, or Pt.

* * * * *